US008351635B2

(12) United States Patent
Sun et al.

(10) Patent No.: US 8,351,635 B2
(45) Date of Patent: Jan. 8, 2013

(54) SILICON-BASED MICROPHONE STRUCTURE WITH ELECTROMAGNETIC INTERFERENCE SHIELDING MEANS

(75) Inventors: Chih Sun, Hsinchu (TW); Shih-Chin Gong, Taipei (TW)

(73) Assignee: Fortemedia, Inc., Sunnyvale, CA (US)

( * ) Notice: Subject to any disclaimer, the term of this patent is extended or adjusted under 35 U.S.C. 154(b) by 666 days.

(21) Appl. No.: 12/264,967

(22) Filed: Nov. 5, 2008

(65) Prior Publication Data

US 2010/0111344 A1 May 6, 2010

(51) Int. Cl.
*H04R 11/04* (2006.01)
(52) U.S. Cl. ........................................ 381/369; 257/416
(58) Field of Classification Search .................. 381/174, 381/175, 322, 323, 324, 355; 257/414–420
See application file for complete search history.

(56) References Cited

U.S. PATENT DOCUMENTS

| 6,522,762 | B1 * | 2/2003 | Mullenborn et al. ......... 381/174 |
| 6,781,231 | B2 | 8/2004 | Minervini |
| 7,202,552 | B2 | 4/2007 | Zhe et al. |
| 2005/0053254 | A1 * | 3/2005 | Kim ............................ 381/369 |
| 2007/0113661 | A1 * | 5/2007 | Benzel et al. .................. 73/715 |
| 2007/0278601 | A1 | 12/2007 | Goodelle et al. |

* cited by examiner

*Primary Examiner* — Ha Tran T Nguyen
*Assistant Examiner* — Kevin Quinto
(74) *Attorney, Agent, or Firm* — McClure, Qualey & Rodack, LLP

(57) ABSTRACT

A silicon-based microphone structure, flip-chip mounted a substrate, has a backside and a via hole formed on the backside. A conductive layer covers the backside and the inner walls of the via hole. A solder ring is attached to the silicon-based microphone structure and electrically connected to the conductive layer.

19 Claims, 7 Drawing Sheets

SILICON-BASED MICROPHONE STRUCTURE WITH ELECTROMAGNETIC INTERFERENCE SHIELDING MEANS

BACKGROUND OF THE INVENTION

1. Field of the Invention

The invention relates to a silicon-based microphone structure with an electromagnetic interference shielding means, low cost, and minimized package size.

2. Description of the Related Art

Many electronic devices have microphones inside. Providing a microphone to have an electromagnetic interference shielding means, low cost, and minimized package size is required.

U.S. Pat. No. 6,781,231 discloses a microelectromechanical system package with an environmental and interference shield. As shown in FIG. 1, a cover 20 is disposed on a substrate 23. The cover 20 serving as an environmental and interference shield includes an outer cup 25a and an inner cup 25b. A plurality of electronic elements 12 is disposed in a chamber 36 formed by the cover 20 and the substrate 23. The cover 20 has a plurality of acoustic ports 44 and 48 allowing the electronic elements 12 to receive external sound.

In operation, however, acoustic resonance is generated in the chamber 36 so that the operating frequency band of the electronic element 12 is narrow. Also, the size of the microelectromechanical system package can not meet modern electronic device requirements for extreme compactness.

U.S. Patent Application Publication No. 2007/0278601 discloses a MEMS (micro-electro-mechanical system) device. As shown in FIG. 2, a MEMS die 110 is mounted on a chip carrier 120 and encapsulated by an enclosure 130. The chip carrier 120 has an acoustic hole 125 covered by the MEMS die 110. The enclosure 130 is used for preventing transmission of any electromagnetic radiation from the MEMS die 110, and any electromagnetic radiation from interfering with the MEMS die 110. The enclosure 130 may be molded using a thermoplastic or thermosetting polymer material, such as epoxy molding compound, liquid crystal polymer, or polyetheretherketone (PEEK), and an electrically conductive material, such as metal particles or carbon fibers or fillers.

Similarly, in operation, acoustic resonance is generated in the enclosure 130 so that the operating frequency band of the MEMS die 110 is narrow. Also, the size of the MEMS device 110 can not meet modern electronic device requirements for extreme compactness.

U.S. Pat. No. 6,522,762 discloses a silicon-based sensor system. As shown in FIG. 3, a transducer 1 and an integrated circuit chip 3 are flip-chip mounted on a silicon carrier substrate 2. The transducer 1 and the integrated circuit chip 3 are electrically connected. The second surface of the silicon carrier substrate 2 is supplied with a plurality of solder bumps 22 for surface mounting onto a printed circuit board (not shown). A lid 5 provides EMI (electromagnetic interference) shielding. An EMI shield 16 is a conductive polymer layer such as silver epoxy, or a metal layer such as electroplated or evaporated Cu or Au.

The lid 5 and the EMI shield 16 are formed not in advance but during the assembly of the silicon-based sensor system. Therefore, the productions of the silicon-based sensor systems are not easy and convenient.

U.S. Pat. No. 7,202,552 discloses a MEMS package using flexible substrates. As shown in FIG. 4, the MEMS package 70 has a MEMS device 40 attached to the flexible substrate 10. A metal cap 54 encapsulates the MEMS device 40 on the flexible substrate 10. The flexible substrate 10 is folded over the metal cap 54 and glued to the top of the metal cap 54. The metal cap 54 and the metal layer of the flexible substrate 10 are electrically connected to form a Faraday cage for EMI/RF shielding.

Similarly, the size of the MEMS package can not meet modern electronic device requirements for extreme compactness. Furthermore, packaging of the MEMS device is complicated, and the flexible substrate 10 is not protected from EMI and RF by any shielding means.

BRIEF SUMMARY OF THE INVENTION

The invention provides a sound receiving device with an electromagnetic interference shielding means, low cost, and minimized package size. The sound receiving device in accordance with an exemplary embodiment of the invention includes a silicon-based microphone structure, a conductive layer, and a solder ring. The silicon-based microphone structure has a backside and a via hole formed on the backside. The conductive layer covers the backside and inner walls of the via hole. The solder ring is attached to the silicon-based microphone structure and electrically connected to the conductive layer.

In another exemplary embodiment, the silicon-based microphone structure includes a micro-electro-mechanical system microphone generating an electrical signal corresponding to sound, and an integrated circuit providing impedance matching and amplifying the electrical signal from the micro-electro-mechanical system microphone.

In yet another exemplary embodiment, the via hole is formed by dry etching.

In another exemplary embodiment, the via hole is formed by inductively coupled plasma reaction ion etch.

In yet another exemplary embodiment, the via hole is formed by wet etching.

In another exemplary embodiment, the via hole is formed by a KOH solution.

In yet another exemplary embodiment, the via hole is trench-shaped.

In another exemplary embodiment, the via hole is dimple-shaped.

In yet another exemplary embodiment, the conductive layer is formed by sputtering, evaporation, or electroplating.

In another exemplary embodiment, the sound receiving device further includes a substrate on which the silicon-based microphone structure is flip-chip mounted.

In yet another exemplary embodiment, the sound receiving device further includes a substrate wherein the solder ring is connected between the silicon-based microphone structure and the substrate.

In another exemplary embodiment, the substrate includes an acoustic chamber acoustically sealed by the solder ring.

In yet another exemplary embodiment, the conductive layer is grounded to the substrate through the solder ring.

In another exemplary embodiment, the sound receiving device further includes a metal bump connected between the silicon-based microphone structure and the substrate.

In yet another exemplary embodiment, the conductive layer is grounded to the substrate through the metal bump.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
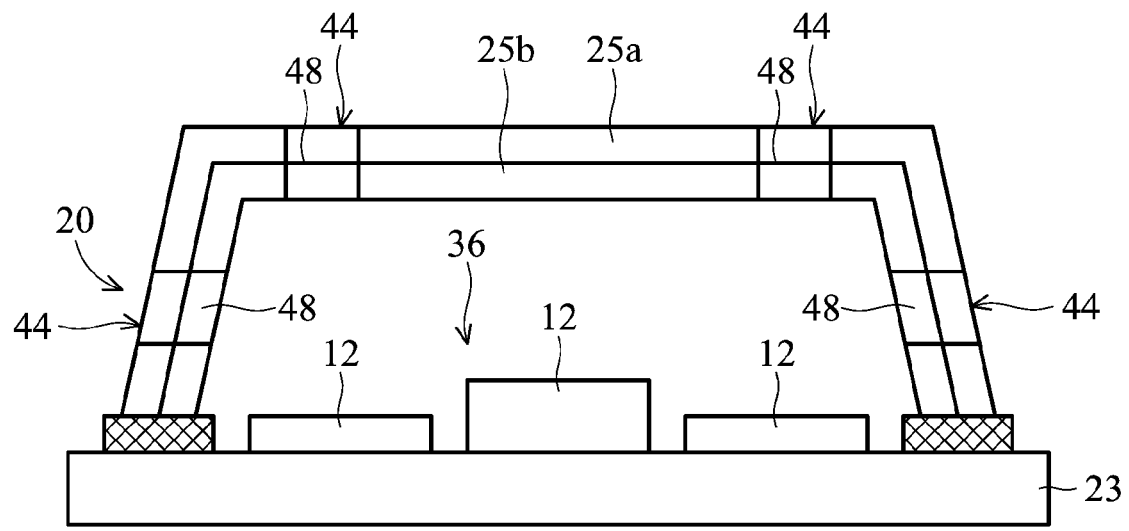
FIG. 1 is a schematic diagram of a microelectromechanical system package disclosed in U.S. Pat. No. 6,781,231.
Figure 2:
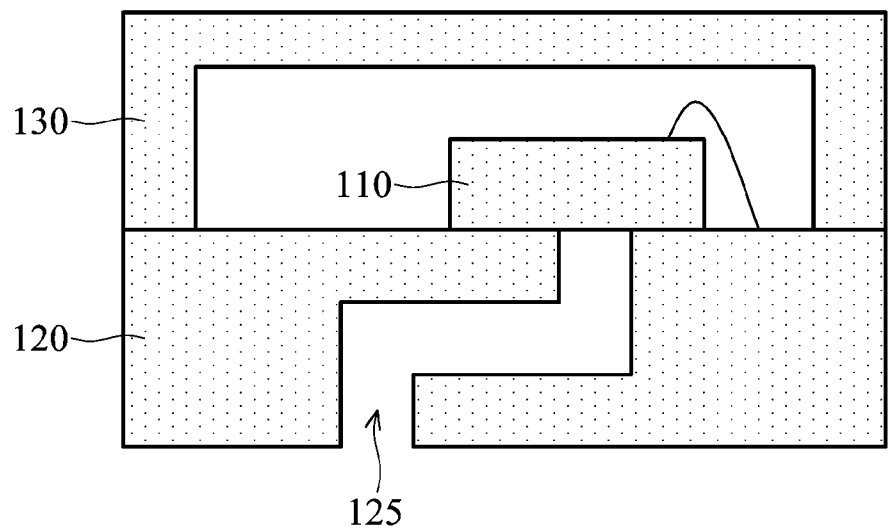
FIG. 2 is a schematic diagram of a MEMS device disclosed in U.S. Patent Application Publication No. 2007/0278601.
Figure 3:
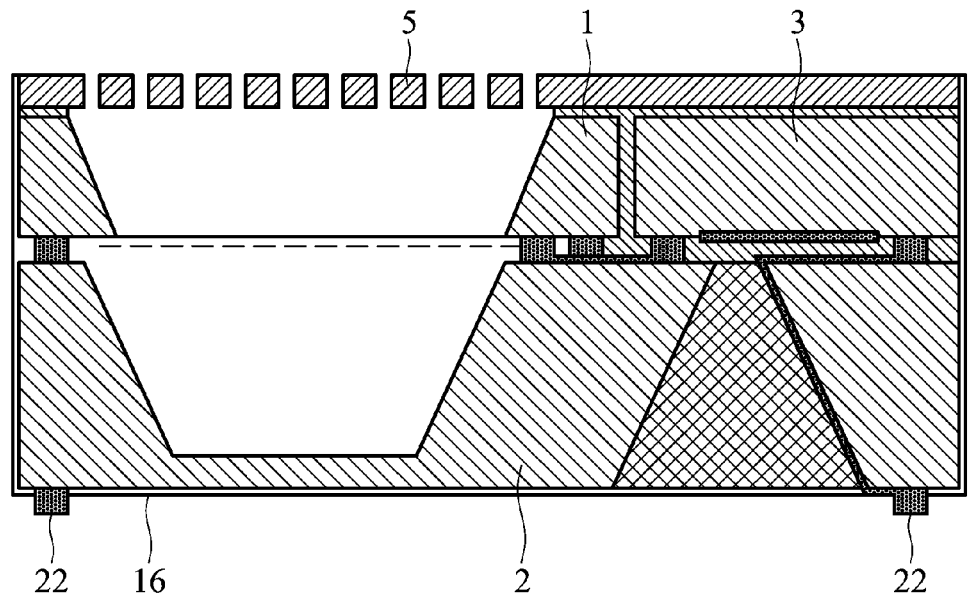
FIG. 3 is a schematic diagram of a silicon-based sensor system disclosed in U.S. Pat. No. 6,522,762.
Figure 4:
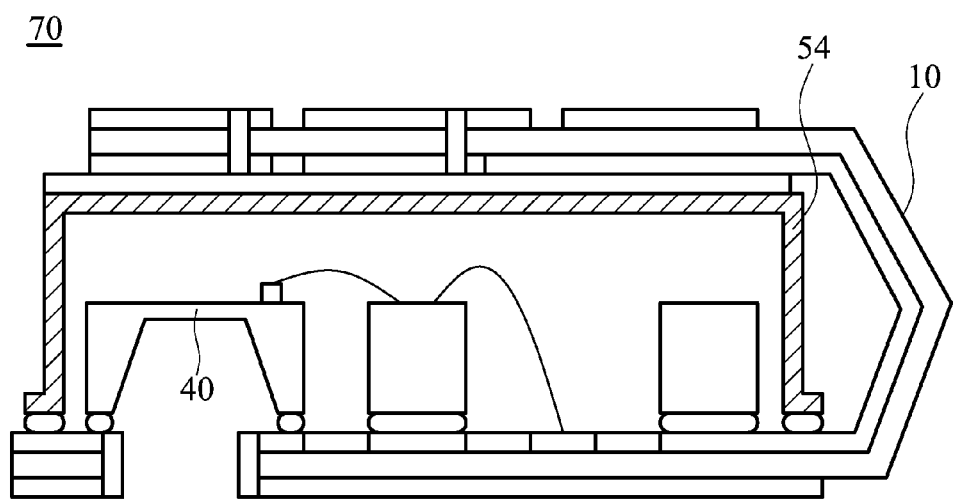
FIG. 4 is a schematic diagram of a MEMS package using flexible substrates disclosed in U.S. Pat. No. 7,202,552.
Figure 5:
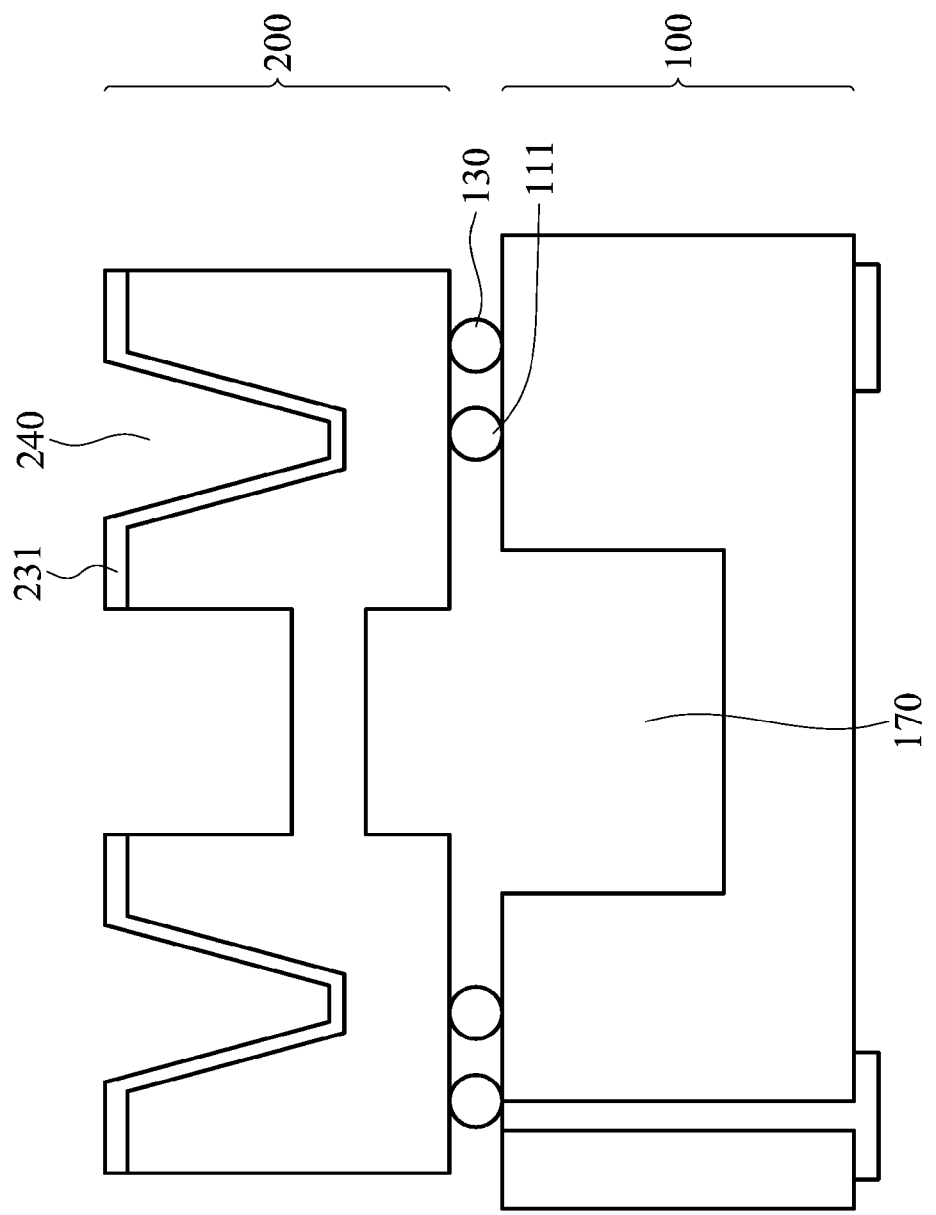
FIG. 5 is a schematic diagram of a sound receiving device in accordance with a first embodiment of the invention.

Referring to FIG. 5, in a first embodiment of the invention, a sound receiving device includes a substrate 100 and a silicon-based microphone structure 200 mounted on the substrate 100 for receiving sound.

Figure 6:
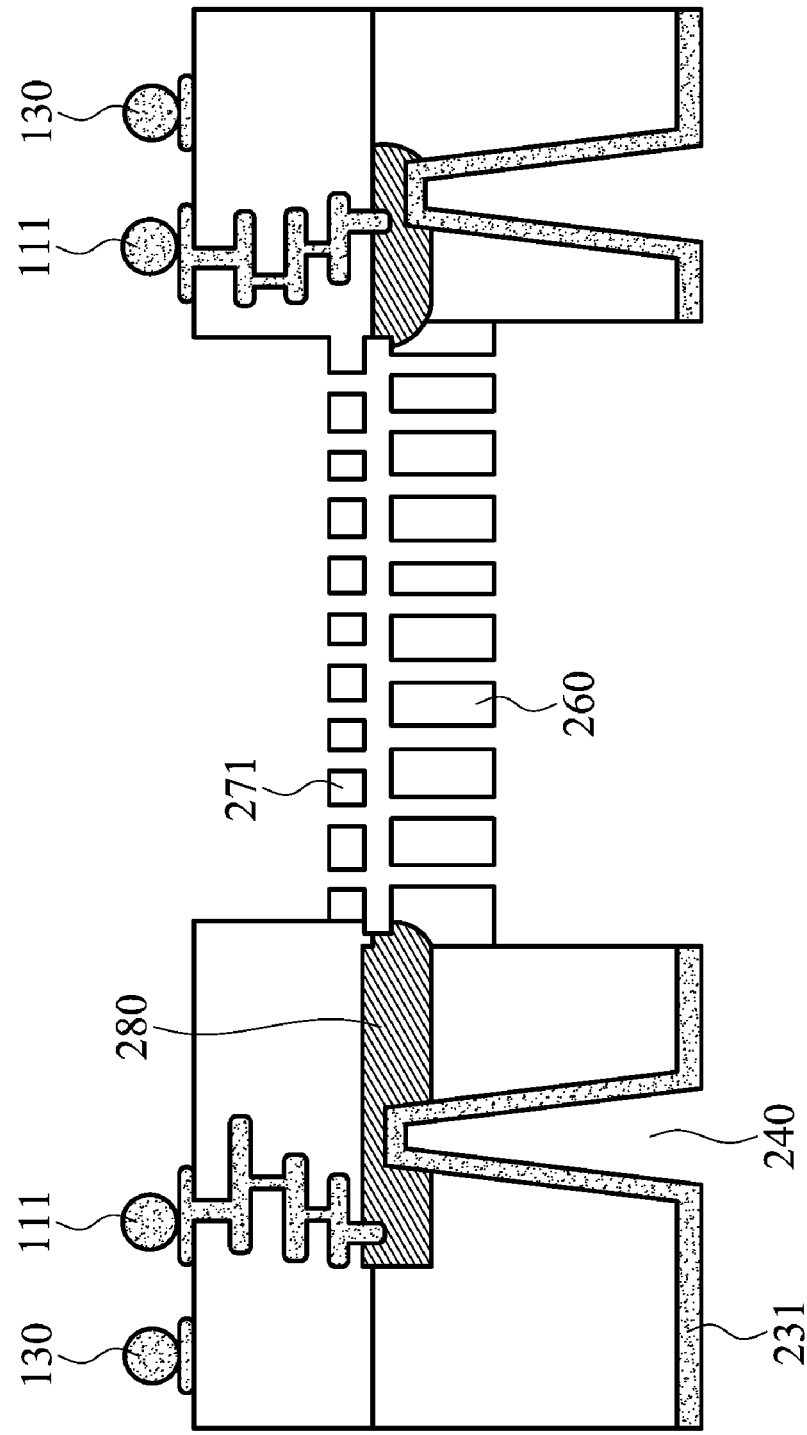
FIG. 6 is a schematic diagram of a silicon-based microphone structure of the sound receiving device of FIG. 5.

The silicon-based microphone structure 200 includes at least one MEMS microphone and an integrated circuit. FIG. 6 depicts a MEMS microphone which includes a back plate 260 and a membrane 271 spaced apart from the back plate 260. The membrane 271 vibrates when sound waves contact the membrane 271. The vibrations are then converted into an electrical signal corresponding to the original sound. The integrated circuit may be a charge pump, a regulator, an amplifier, etc., providing impedance matching and amplifying the electrical signal from the MEMS microphone.

The substrate 100 may be a printed circuit board or a ceramic substrate. As shown in FIG. 5, the substrate 100 has an acoustic chamber 170 in which air is compressed during vibrations of the membrane 271 of the silicon-based microphone structure 200.

A solder ring 130, connected between the silicon-based microphone structure 200 and the substrate 100, serves as an acoustic seal for reducing the acoustic impendence and preventing an entry of external sound into the acoustic chamber 170.

To prevent the silicon-based microphone structure 200 from external electromagnetic interference, the solder ring 130 is provided on the substrate 100 by screen printing and is grounded. To further reduce the electromagnetic interference, the substrate 100 is designed as the surface mount type. That is, all components are surface mounted on the substrate 100.

The silicon-based microphone structure 200 has at least one backside via hole 240 which is formed by, for example, dry etching (e.g. inductively coupled plasma reaction ion etch by using a deep reaction ion etcher) or wet etching (e.g. using KOH solution). The backside via hole 240 may extend to the N-well, P-well, poly-silicon layer, or metal layer, or in the silicon substrate.

In the silicon-based microphone structure 200, a wafer has a conductive layer 231 on its back side, which is formed by sputtering, evaporation, or electroplating, covers the inner walls of the backside via hole 240, and serves as an electromagnetic interference shielding means. At least one metal bump 111 is provided on the silicon-based microphone structure 200. The wafer of the silicon-based microphone structure 200 further has at least one well 280 on its front side, which is formed by the CMOS (Complementary Metal-Oxide Semiconductor) process and connected to the metal bump 111.

The silicon-based microphone structure 200 is mounted on the substrate 100 by the flip chip technology, with the metal bump 111 connected therebetween. By the flip chip technology, not only the signal transmission distance between the substrate 100 and other electronic components but also the size of the packaged sound receiving device can be reduced.

The solder ring 130 is formed on the substrate 100. Alternatively, the solder ring 130 is replaced with a metal film formed on the substrate 100 and solder provided on the wafer of the silicon-based microphone structure 200. The metal bump 111 connected between the silicon-based microphone structure 200 and the substrate 100 may be a solder bump or a solder ball. The solder ring 130 and the metal bump 111 may be made of Sn, SnAg, SnAu, SnPb, any metal, metal mixture, or metal compound.

Figure 7A:
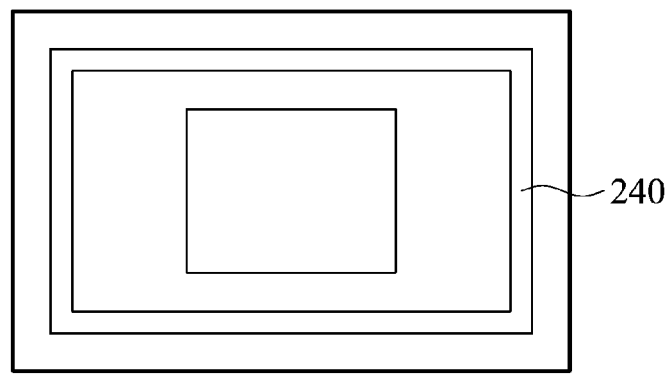
FIG. 7A depicts a first type of via hole formed on the silicon-based microphone structure of FIG. 6.
Figure 7B:
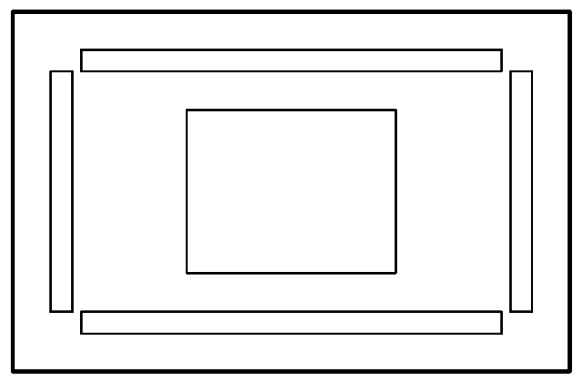
FIG. 7B depicts a second type of via holes formed on the silicon-based microphone structure of FIG. 6.
Figure 7C:
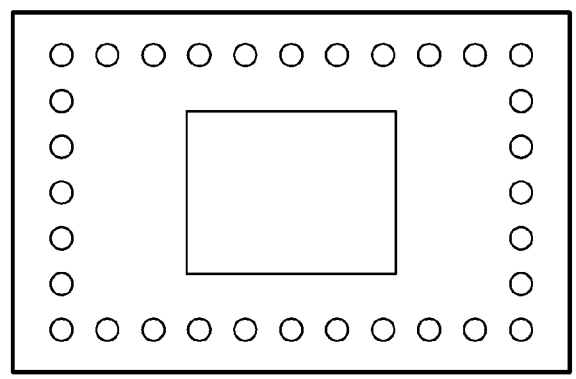
FIG. 7C depicts a third type of via holes formed on the silicon-based microphone structure of FIG. 6.

The backside via hole 240 can be implemented in different shapes and forms. As shown in FIG. 7A, a trench-shaped via hole 240 is provided on a silicon-based microphone structure. In FIG. 7B, four trench-shaped via holes are discretely provided on a silicon-based microphone structure. In FIG. 7C, a plurality of dimple-shaped via holes is provided on a silicon-based microphone structure.

From the above descriptions, it is understood that the conductive layer 231 covers the backside of the silicon-based microphone structure 200 and the inner walls of the via hole 240, is electrically connected to the metal bump 111, and is grounded to the substrate 100 through the metal bump 111, thus serving as an electromagnetic interference shielding means.

Figure 8:
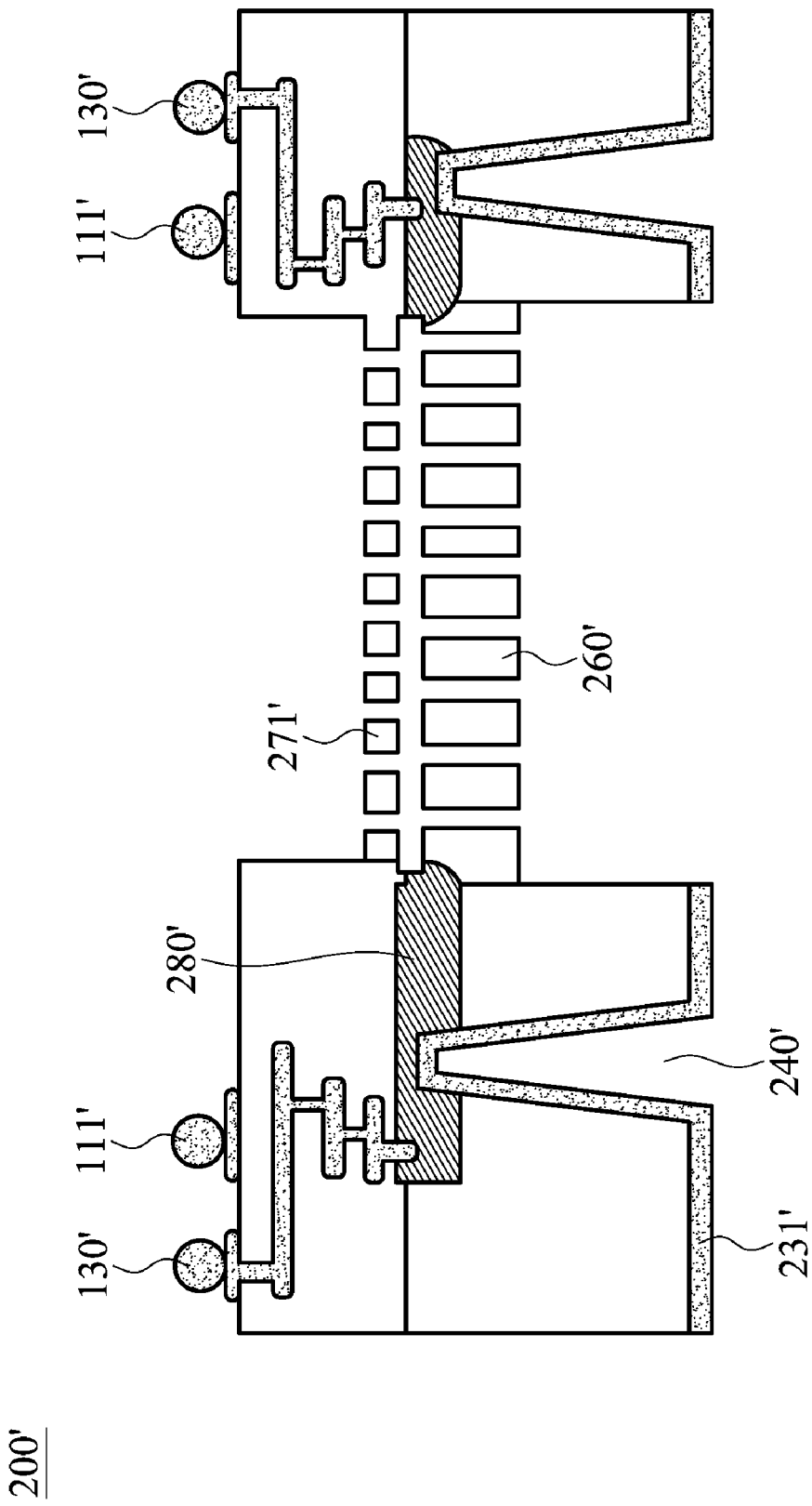
FIG. 8 is a schematic diagram of a silicon-based microphone structure of a sound receiving device in accordance with a second embodiment of the invention.

In a second embodiment of the invention, the substrate is identical to that of the first embodiment. Thus, the descriptions of the substrate are omitted. Referring to FIG. 8, the silicon-based microphone structure 200' includes a MEMS (micro-electro-mechanical system) microphone combined with at least one integrated circuit (e.g. charge pump, regulator, amplifier, etc.). The MEMS microphone includes a back plate 260' and a membrane 271' spaced apart from the back plate 260'. The membrane 271' vibrates when sound waves contact the membrane 271'. The vibrations are then converted into an electrical signal corresponding to the original sound. The integrated circuit provides impedance matching and amplifies the electrical signal from the MEMS microphone.

A solder ring 130', connected between the silicon-based microphone structure 200' and the substrate 100, serves as an acoustic seal for reducing the acoustic impendence and preventing an entry of external sound into the acoustic chamber 170.

To prevent the silicon-based microphone structure 200' from external electromagnetic interference, the solder ring 130' is provided on the substrate 100 by screen printing and is grounded.

The silicon-based microphone structure 200' has at least one backside via hole 240' which is formed by, for example, dry etching (e.g. inductively coupled plasma reaction ion etch) or wet etching (e.g. using KOH solution). The backside via hole 240' may extend to the N-well, P-well, poly-silicon layer, or metal layer, or in the silicon substrate.

In the silicon-based microphone structure 200', the wafer has a conductive layer 231' on its back side, which is formed by sputtering, evaporation, or electroplating, covers the inner walls of the via hole 240', and serves as an electromagnetic interference shielding means. The wafer of the silicon-based microphone structure 200' further has at least one well 280' on its front side, which is formed by the CMOS (Complementary Metal-Oxide Semiconductor) process and connected to the solder ring 130'.

The silicon-based microphone structure 200' is mounted on the substrate 100 by the flip chip technology, with the metal bump 111' connected therebetween. By the flip chip technology, not only the signal transmission distance between the substrate 100 and other electronic components but also the size of the packaged sound receiving device can be reduced.

The solder ring 130' is formed on the substrate 100. Alternatively, the solder ring 130' is replaced with a metal film formed on the substrate 100 and solder provided on the wafer of the silicon-based microphone structure 200'. The metal bump 111' connected between the silicon-based microphone structure 200' and the substrate 100 may be a solder bump or a solder ball. The solder ring 130' and the metal bump 111' may be made of Sn, SnAg, SnAu, SnPb, any metal, metal mixture, or metal compound.

Figure 9A:
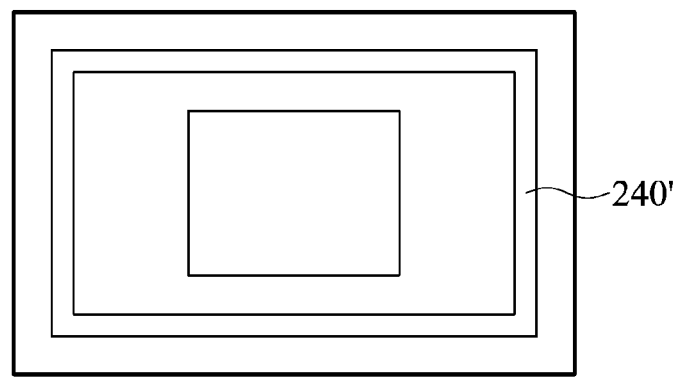
FIG. 9A depicts a first type of via hole formed on the silicon-based microphone structure of FIG. 8.
Figure 9B:
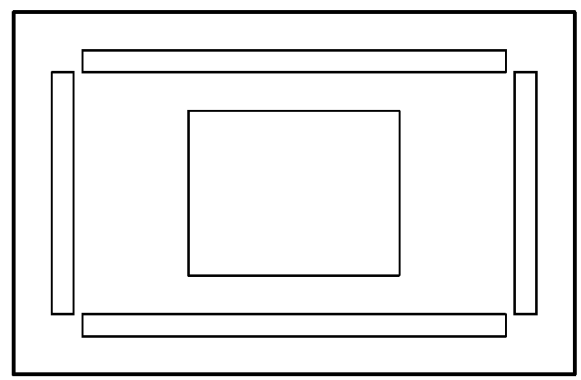
FIG. 9B depicts a second type of via holes formed on the silicon-based microphone structure of FIG. 8.
Figure 9C:
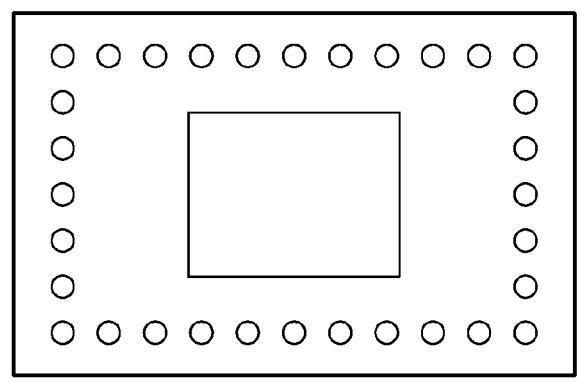
FIG. 9C depicts a third type of via holes formed on the silicon-based microphone structure of FIG. 8.

The backside via hole 240' can be implemented in different shapes and forms. As shown in FIG. 9A, a trench-shaped via hole 240' is provided on a silicon-based microphone structure. In FIG. 9B, four trench-shaped via holes are discretely provided on a silicon-based microphone structure. In FIG. 9C, a plurality of dimple-shaped via holes is provided on a silicon-based microphone structure.

From the above descriptions, it is understood that the conductive layer 231' covers the backside of the silicon-based microphone structure 200' and the inner walls of the via hole 240', is electrically connected to the solder ring 130', and is grounded to the substrate 100 through the solder ring 130', thus serving as an electromagnetic interference shielding means.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sound receiving device, comprising:
   a silicon-based microphone structure having a backside and a via hole formed on the backside;
   a conductive layer covering the backside and inner walls of the via hole;
   a solder ring attached to the silicon-based microphone structure and electrically connected to the conductive layer, and
   a substrate, wherein the solder ring is connected between the silicon-based microphone structure and the substrate, and the substrate includes an acoustic chamber acoustically sealed by the solder ring,
   wherein the silicon-based microphone structure includes a micro-electro-mechanical system microphone generating an electrical signal corresponding to sound, and an integrated circuit providing impedance matching and amplifying the electrical signal from the micro-electro-mechanical system microphone.

2. The sound receiving device as claimed in claim 1, wherein the via hole is formed by dry etching.

3. The sound receiving device as claimed in claim 2, wherein the via hole is formed by inductively coupled plasma reaction ion etch.

4. The sound receiving device as claimed in claim 1, wherein the via hole is formed by wet etching.

5. The sound receiving device as claimed in claim 4, wherein the via hole is formed by a KOH solution.

6. The sound receiving device as claimed in claim 1, wherein the via hole is trench-shaped.

7. The sound receiving device as claimed in claim 1, wherein the via hole is dimple-shaped.

8. The sound receiving device as claimed in claim 1, wherein the conductive layer is formed by sputtering, evaporation, or electroplating.

9. The sound receiving device as claimed in claim 1, further comprising a substrate on which the silicon-based microphone structure is flip-chip mounted.

10. The sound receiving device as claimed in claim 1, wherein the conductive layer is grounded to the substrate through the solder ring.

11. The sound receiving device as claimed in claim 1, further comprising a metal bump connected between the silicon-based microphone structure and the substrate.

12. The sound receiving device as claimed in claim 11, wherein the conductive layer is grounded to the substrate through the metal bump.

13. The sound receiving device as claimed in claim 1, wherein a sound inlet is formed on the backside of the silicon-based microphone, and the acoustic chamber faces to the sound inlet to reflect sound transmitted from the sound inlet.

14. The sound receiving device as claimed in claim 13, wherein the silicon-based microphone structure further comprises a back plate and a membrane spaced apart from the back plate, wherein the back plate and the membrane are disposed between the sound inlet and the acoustic chamber.

15. A sound receiving device, comprising:
   a silicon-based microphone structure having a backside and a via hole formed on the backside;
   a conductive layer blanketed on the backside and inner walls of the via hole;
   a solder ring attached to the silicon-based microphone structure and electrically connected to the conductive layer; and
   a substrate, wherein the solder ring is connected between the front side of the silicon-based microphone structure and the substrate, and the substrate comprises an acoustic chamber acoustically sealed by the solder ring.

16. The sound receiving device as claimed in claim 15, wherein a sound inlet is formed on the backside of the silicon-based microphone to receive sound, and the soldering is attached to a front side of the silicon-based microphone structure which is opposite to the backside.

17. The sound receiving device as claimed in claim 15, wherein the conductive layer is connected to the substrate through the solder ring and is electrically grounded.

18. The sound receiving device as claimed in claim 15, further comprising a metal bump connected between the front side of the silicon-based microphone structure and the substrate.

19. The sound receiving device as claimed in claim 18, wherein the conductive layer is connected to the substrate through the metal bump and is electrically grounded.

* * * * *